United States Patent
Conner et al.

(10) Patent No.: US 6,486,693 B1
(45) Date of Patent: Nov. 26, 2002

(54) METHOD AND APPARATUS FOR TESTING INTEGRATED CIRCUIT CHIPS THAT OUTPUT CLOCKS FOR TIMING

(75) Inventors: George Conner, Los Gatos; Peter Reichert, Thousand Oaks, both of CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/577,255

(22) Filed: May 19, 2000

(51) Int. Cl.$^7$ ............................................. G01R 31/26

(52) U.S. Cl. ..................... 324/765; 324/158.1; 714/700

(58) Field of Search ............................. 324/158.1, 765, 324/73.1, 76.54, 700; 702/119; 714/700, 730; 368/46, 47, 113, 118

(56) References Cited

U.S. PATENT DOCUMENTS 4,792,932 A * 12/1988 Bowhers et al. ............ 368/113
5,794,175 A * 8/1998 Conner ....................... 702/119

* cited by examiner

Primary Examiner—Michael J. Sherry
Assistant Examiner—Paresh Patel
(74) Attorney, Agent, or Firm—Lance M. Kreisman

(57) ABSTRACT

An automatic test system useful for testing source synchronous devices at high speed. The data outputs of the device under test are routed to channel circuitry within the test system through coaxial cables. The test system includes a buffer amplifier on a device interface board to fan out the DATA CLOCK generated by the device under test to that channel circuitry. The interconnection between the buffer amplifier and the channel circuitry is provided through a coax with low dielectric constant, to compensate for the delay introduced by the buffer amplifier.

18 Claims, 3 Drawing Sheets

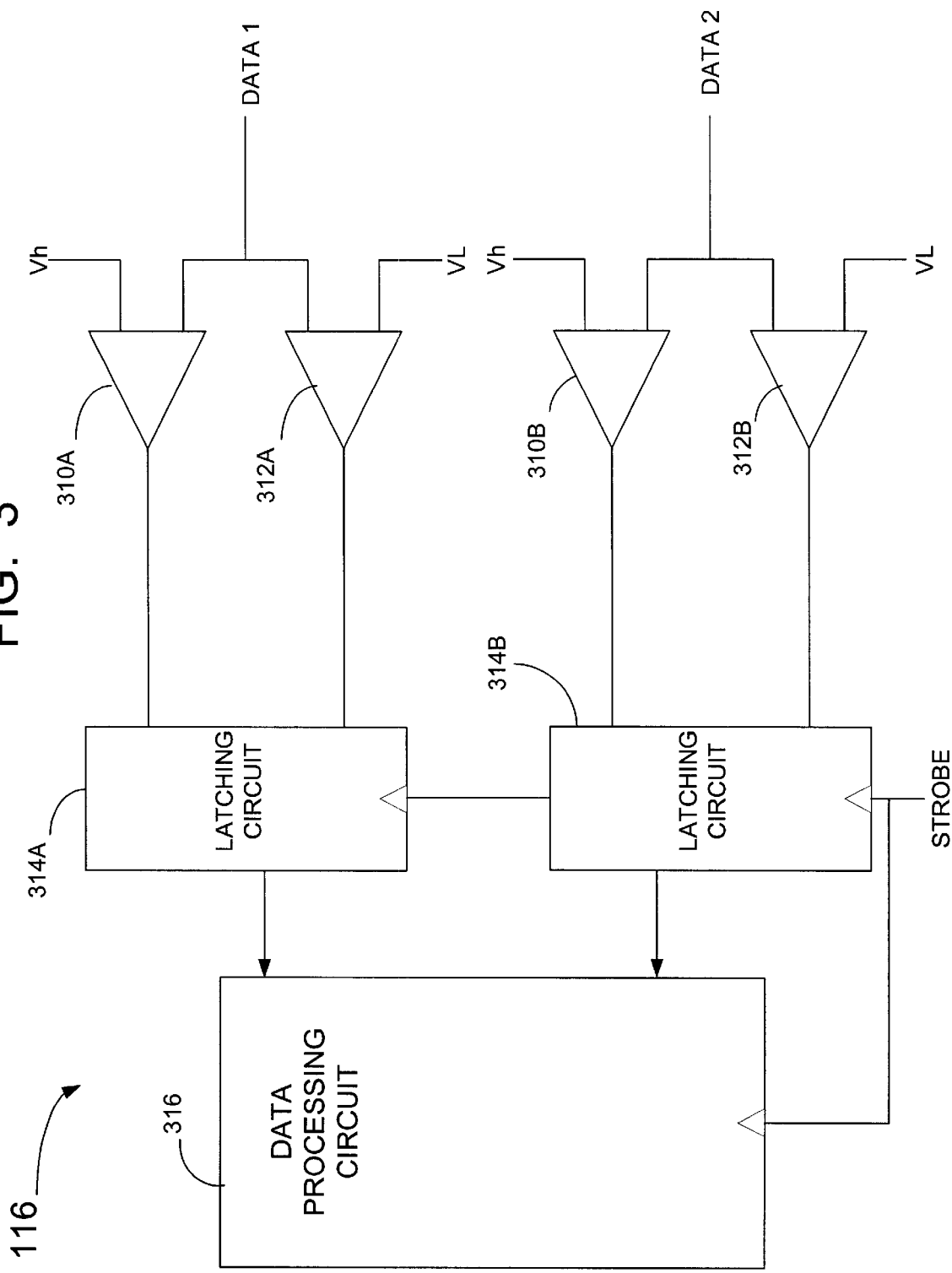

METHOD AND APPARATUS FOR TESTING INTEGRATED CIRCUIT CHIPS THAT OUTPUT CLOCKS FOR TIMING

This invention relates generally to automatic test equipment and more specifically to the testing of integrated circuit chips that output clocks for timing.

In the manufacture of integrated circuit chips, the chips are generally tested at least once. The test results are used in various ways. They can be used to separate good chips from faulty chips. They can also be used to grade parts. For example, chips are usually rated by the maximum speed at which they can operate or by the amount of the data they can store, with the chips having a higher speed or larger memories being sold at higher prices. Often, variations in the chip manufacturing process result in some chips operating at a higher speed or having more usable memory. The test results allow the parts that have greater capabilities to be graded for sale at a higher price. In some cases, defects on chips can be repaired using laser repair stations or similar equipment. Another way that test results might be used in the manufacture of chips is to guide the repair of chips.

To test parts in a manufacturing setting, automatic test equipment (sometimes called a "tester") is used. Traditional automatic test equipment contains numerous "channels" or "pins." A channel is a circuit that can generate or measure a single digital signal. To test a chip, each lead of the chip is connected to a channel on the tester. Each channel is controlled by a clock within the tester. For each period of the tester clock, each channel can generate or measure the signal.

The channel circuitry is often highly programmable so that the automatic test equipment can simulate virtually any kind of input to the chip or detect whether an expected output, regardless of the format of the output, was produced. In addition to accepting programming inputs that define the shape of the signal that is generated or measured, the channel circuitry can also be programmed to generate or check for an expected signal at a precise time.

When the chips are used to make electronic systems, such as a computer, an error in the time when a signal is produced can be just as disruptive as a signal of the wrong value or form. Most chips are clocked, meaning that they have a clock input that changes state on a periodic basis. The chip latches a set of input signals at a set time in relation to the change of state of the clock signal. If valid data signals are not applied to the chip at this time, the chip will latch improper data and therefore the computer will likely malfunction. In a computer, the outputs of one chip are connected to the inputs of another. If the first chip does not produce output signals at the appropriate time relative to a clock input, the next chip receives its inputs at an incorrect time relative to the clock.

Traditionally, a common clock was used for every chip inside an electronic system. By having each chip produce its outputs and latch its inputs at certain times in relation to the common clock, it could be assured that valid data would be latched.

A problem arises in designing systems with common clocks. As signals move from one part of a system to another, some get slowed down more than others. As a result, signals that ought to occur at the same time often wind up occurring at different times. These time differences are sometimes called "skew." When designing a system, skew must be taken into account. Even though valid data is expected to arrive at a chip at a certain time, the designer should design the system to wait until the maximum possible skew time after the data is expected before it latches the data. Having to wait this time reduces the number of processing operations the computer can perform in a second and is therefore undesirable.

More recently, new clocking architectures have been used in systems that need to process many operations per second. These architectures are sometimes referred to by the terms "source synchronous," "clock forwarding" or "echo clocks," all of which are generally synonymous. In these architectures, each chip producing output signals also produces an output clock signal that is fed to the chips that need to latch the output signals as inputs. The data clocks are derived from the common clock so that all chips in the system are operating at the same speed. However, the system still works even if the data clock and the common clock are not synchronized.

Because the data clock and the data signals are generated by the same chip and travel over similar paths, there is less skew between the data signals and the data clock than between the data signals and the common clock. Consequently, latching data signals based on the data clock wastes less time waiting to latch signals. U.S. Pat. No. 5,774,001 is an example of such a system.

However, testing chips made for source synchronous systems can be a problem. In testing parts with a common clock system, the tester can generate a signal to use as a common clock that has a set timing relationship to the tester clock. Channels measuring the data signals can operate at set times relative to the tester clock so that the time relationship between these measurements and the signal being used as the common clock would be known.

However, we have recognized a difficulty in testing chips made for a source synchronous system using conventional test equipment. Measurement times need to be tied to the data clock output by the chip under test rather than to a signal generated by the tester. Timing the measurement of the data values is a problem because the data clock runs to a different tester channel than the data signals. Additionally, the relative timings between the data signals and the data clock tend to exhibit jitter. To control the time at which the data signals were measured, the data clock would somehow have to be routed from its channel to a control input of each channel receiving a data signal associated with that clock. But, by the time the data clock signal could travel this distance, it would no longer have the required time relationship to the data signals. Thus, an improved method for testing source synchronous parts is required.

SUMMARY OF THE INVENTION

With the foregoing background in mind, it is an object of the invention to provide a test system that can accurately test parts made for source synchronous systems.

The foregoing and other objects are achieved in a test system having a fanout circuit very close to the device under test. The fanout circuit has an input connected to the data clock of the device under test and outputs connected to channel circuits in the tester that receive data from the device under test. These channel circuits use the data clock to strobe inputs. Different connection materials are used to interconnect the data clock and data signals to the tester.

In a preferred embodiment, coax with a low dielectric constant core is used to connect the data clock to the tester and a higher dielectric constant core coax is used to connect the data channels.

BRIEF DESCRIPTION OF THE DRAWINGS

The invention will be better understood by reference to the following more detailed description and accompanying drawings in which

FIG. 3 is a schematic showing the channel circuitry of FIG. 2 in greater detail.

DESCRIPTION OF THE PREFERRED EMBODIMENT

Figure 1:
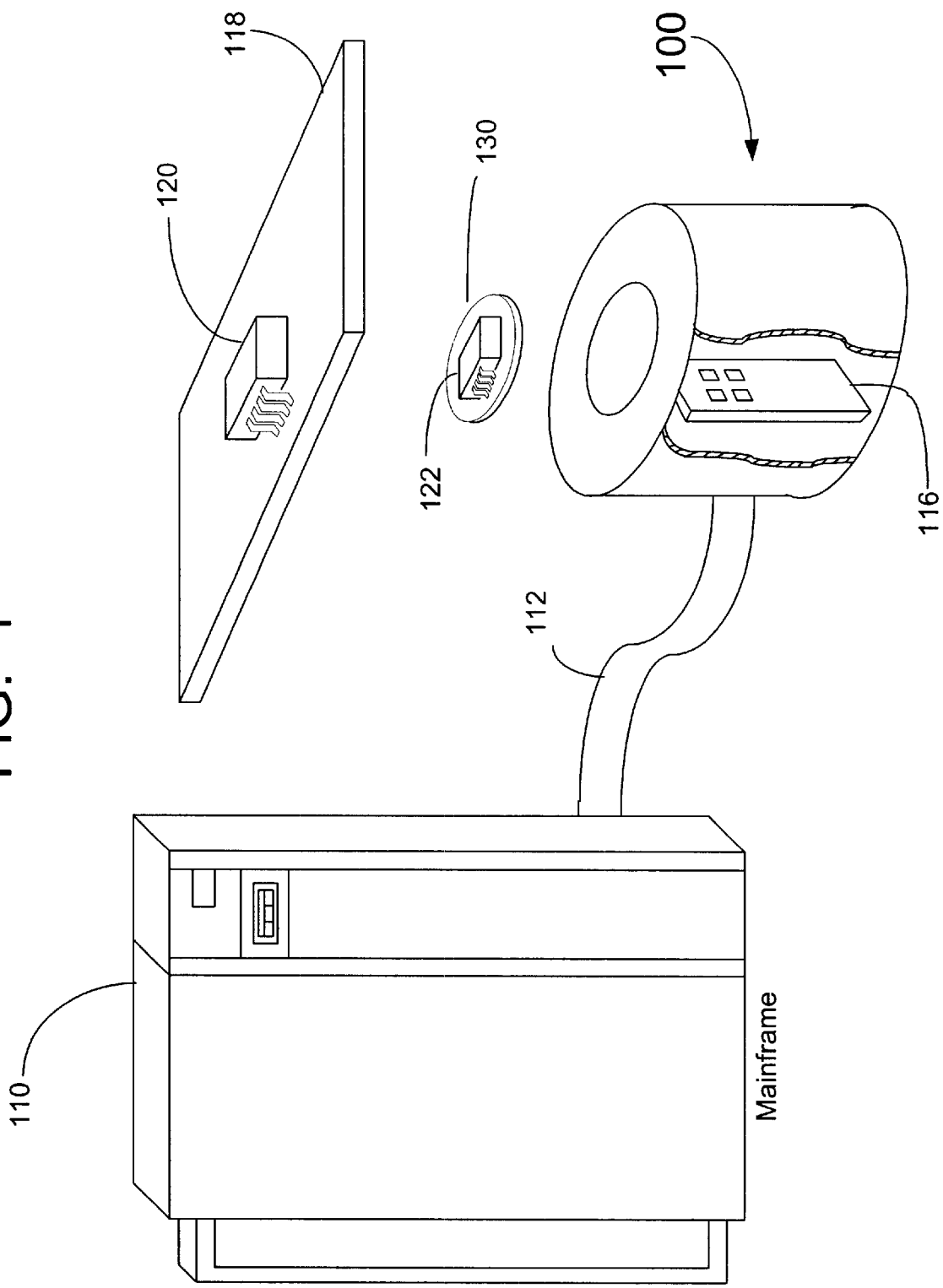
FIG. 1 is a sketch of a test system showing the physical configuration of the components of the invention.

FIG. 1 shows a generalized sketch of a test system that is suited for testing source synchronous parts. Tester main frame 110 contains part of the circuitry needed to run tests. Testers with main frames such as main frame 110 are known in the art. Included within tester main frame 110 are power supplies and circuitry that controls the overall test.

Tester main frame 110 is connected through cable 112 to a test head 114. Test head 114 contains a plurality of channel cards 116. Only one such channel card 116 is shown for clarity, but test head 114 contains as many channel cards as necessary to provide the required number of channels that generate or measure signals during a test. Test heads containing channel cards are known.

During a test, test head 114 has mounted thereon a contactor apparatus more commonly referred to as a device interface board (DIB) 118. DIB 118 contains a socket or other known device for making electrical connection to a device under test (DUT) 120. DIB 118 can be a conventional printed circuit board. Components for use in generating or measuring test signals can also be mounted to it. Such a DIB is conventional in the testing art.

As will be described in greater detail below, DIB 118 has a module 130 mounted to its underside. Module 130 contains thereon a buffer amplifier 122. Module 130 could be simply a printed circuit board or could contain more complex packaging as known in 20 the art. Module 130 is electrically connected to DIB 118 so that select signals from DUT 120 can pass through buffer amplifier 122.

The DIB is electrically connected to the channel cards 116 inside test head 114. In some scenarios, spring loaded probes, sometimes called "pogo pins" are used. The springs press the probes against conductive pads on the DIB. Pogo pins can be single ended or co-axial where greater signal integrity is required. Alternatively, the device interface board can be hardwired to the channel cards inside test head 114.

At least some portion of the channel cards 116 are electrically connected to the module 130 so that the outputs of buffer amplifier 122 may be passed to those channel cards 116. Electrical connections are, in the preferred embodiment, made through coaxial cables (210 and 212—FIG. 2). For ease of use connectors may be attached to the end of the cables to make connections in a convenient way, as is known in the art.

Generally, a specific device interface board is created for each type of chip to be tested with the test system 100. DIB 118 represents a device interface board to be used to test a source synchronous chip. Such a chip will have data outputs and an I/O clock output.

In a preferred embodiment of the invention, there are different types of connections between DIB 118 and the channel cards 116 for data clock signals and data outputs. As will be described in greater detail below, the connections for both the data clock signal and the data signals will preferably be through a device that creates a transmission line. However, the transmission lines that carry the data clock signals to channel cards 116 will contain dielectric with a lower effective dielectric constant than the transmission lines that carry the data signals. Lower effective dielectric constant results in faster signal propagation along the transmission line. In this way, the propagation delay between DIB 118 and the channel cards 116 is shorter for the data clock signal than for the data signals.

A transmission line might be created in numerous ways. Flex circuits with ground planes can be used. Coaxial pogo pins might be used. Alternatively, coaxial cable might be used.

Figure 2:
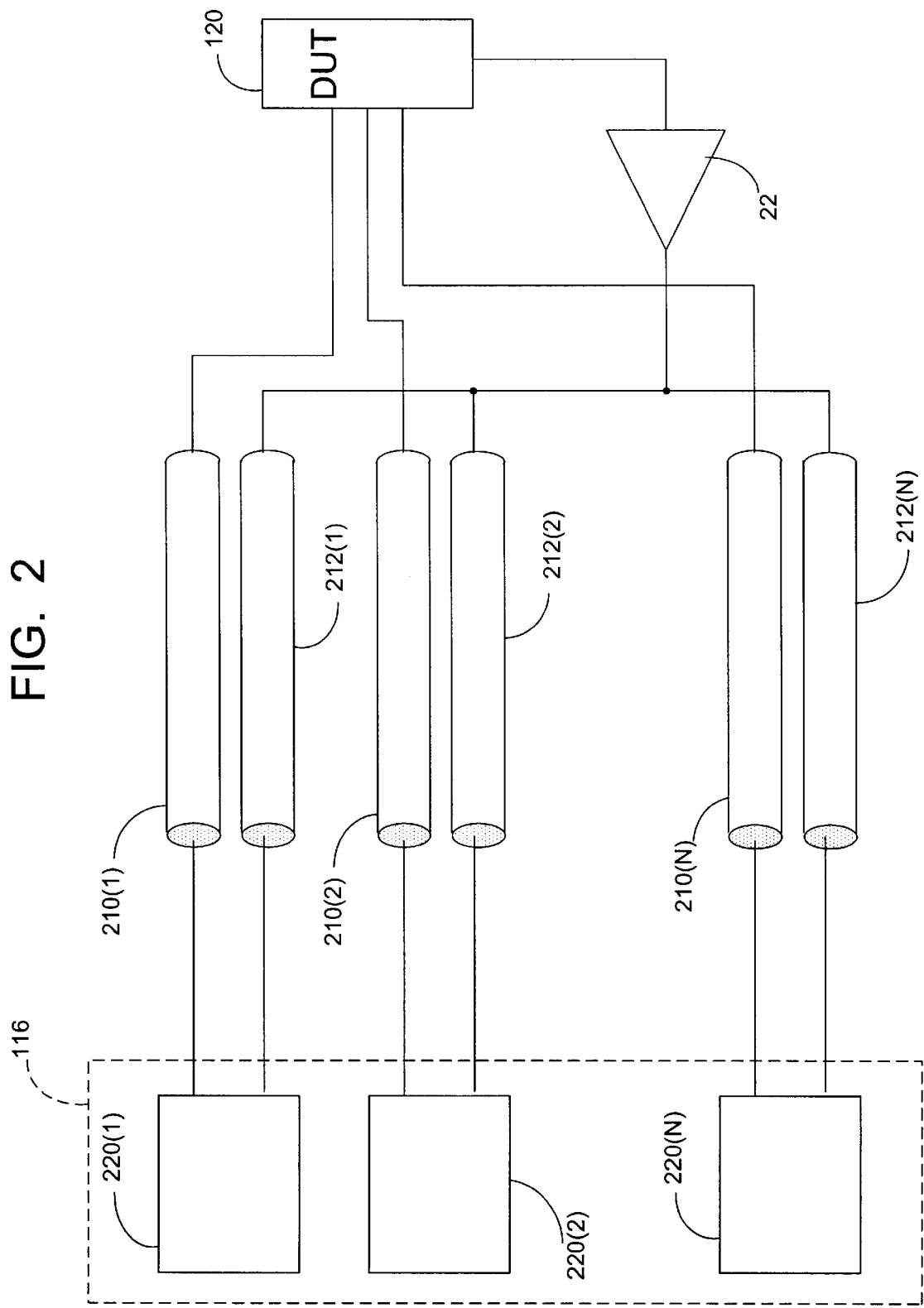
FIG. 2 is a schematic showing the electrical interconnection of the components of the invention.

Turning now to FIG. 2, additional details of the electrical connections are shown. A channel card 116 is shown to contain a plurality of channel chips 220(1) . . . 220(N). As mentioned above, a typical test system could have multiple channel cards, but a single channel card is shown for simplicity. Each of the channel chips 220(1) . . . 220(N) contains the circuitry needed to generate or measure the signals for one or more channels. Use of channel chips to build an automatic test system is well known in the art.

DUT 120 is shown to have DATA and DATA CLOCK outputs. Each of the DATA lines represents a signal that is to be measured during a test. The DATA CLOCK provides the timing of when these signals should be measured, as is conventional in a source synchronous chip.

The DATA CLOCK output runs to buffer amplifier 122 on module 130 (FIG. 1). This connection is preferably made through signal traces on DIB 118 to the point of connection to module 130. Buffer amplifier 122 boosts the power level of the DATA CLOCK signal so that it can be distributed to multiple channel cards 116 within test head 114 and to multiple channel chips 220(1) . . . 220(N) on those channel cards. Amplifier 122 has an inherent delay associated with it. A delay on the order of 0.5 nsec is typical for commercially available amplifiers.

The connection between buffer amplifier 122 and channel chips 220(1) . . . 220(N) is preferably made through a series of coaxial cables 212(1) . . . 212(N). In the preferred embodiment, coaxial cables 212(1) . . . 212(N) are filled with a dielectric foam. The air spaces trapped within the dielectric to create the foam also lower the dielectric constant of the foam in comparison to a solid material of the same type. As a specific example, the foam can be TEFLON® (a registered trademark of E. I. Du Pont De Nemours and Company for a polymer of fluorinated hydrocarbons).

Such coax is commercially available. Preferably, the coax has an impedance that matches the output of the buffer amplifier 122. However, design of controlled impedance systems is known in the art.

The connections between DIB 118 and channel chips 220(1) . . . 220(N) to carry the DATA signals from DUT 120 are made through coaxial cables 210(1) . . . 210(N). Each of the coaxial cables 210(1) . . . 210(N) are similar in length to a corresponding one of the coaxial cables 212(1) . . . 212(N). However, coaxial cables 210(1) . . . 210(N) are made with a different dielectric than cables 212(1) . . . 212(N) so that they will have a higher dielectric constant. In a preferred embodiment, the dielectric is solid (un-foamed) TEFLON® (a registered trademark of E. I. Du Pont De Nemours and Company for a polymer of fluorinated hydrocarbons). Coax with such properties is commercially available.

In the illustrated embodiment, a single data line is shown running to each channel chip 220(1) . . . 220(N). In a conventional test system, each channel chip often contains the circuitry to measure multiple test signals. Thus, multiple data lines might run to each channel chip. However, only one such connection is shown in FIG. 2 for simplicity.

Turning to FIG. 3, details of a portion of the circuitry on a channel card 116 are shown. FIG. 3 shows two data signals, DATA1 and DATA2 running to channel card 116. Each of the signals is shown running to a HI comparator, 310A or 310B, respectively. Each signal also runs to a LO comparator 312A or 312B, respectively. A HI and LO comparator together forms what is known in the art as a window comparator.

The two outputs of the window comparator tell the state of the signal at any given time. For example, a HI output of HI comparator 310A and a LO output of LO comparator 312A indicates that signal DATA1 is HI. When DATA1 is LO, the output of HI comparator 310A should be LO and the output of LO comparator 312A should be HI. When the outputs of both HI comparator 310A and LO comparator 312A are HI, it indicates that the signal DATA1 is in a transition state. Thus, the precise time at which the output of the window comparators is checked can determine the output.

FIG. 3 shows that the output of each window comparator is latched by latching circuits 314A and 314B, respectively. Many ways to implement a latch are well known and the specific circuit layout is not important for the invention. In particular, it is not necessary that the latching circuit be a separate circuit element. A latch function might be built into either the comparator output stage or combined with other circuit elements on the board.

Latching circuits 314A and 314B latch the value at their inputs when the STROBE signal is asserted. To test a source synchronous part, the STROBE signal should have the same timing characteristics as the DATA CLOCK signal from DUT 120. Thus, the STROBE signal is derived from the output of amplifier 122 and transmitted through a foam-core coax such as coax 212(1) . . . 212(N).

In a preferred embodiment, the dielectric constant of the foam-core coax is chosen so that the difference in propagation delay through a sold core coax such as 210(1) . . . 210(N) and a corresponding foam-core coax such as 212(1) . . . 212(N) equals the propagation delay through buffer amplifier 122. In this way, the DATA and DATA CLOCK signals will arrive at a channel card with the same relative timing as when they leave DUT 120. For example, if buffer amplifier introduces a delay of 0.5 nsec, each of the foam-core coaxial cables 212(1) . . . 212(N) is made to have 0.5 nsec less propagation delay than a corresponding solid core coaxial cable 210(1) . . . 210(N). Moreover, for further accuracy, a programmable delay may be included such as a timing vernier (not shown) to adjust the delay of the DATA signals at the input of the receiver.

The outputs of latching circuitry 314A and 314B run to data processing circuitry 316. Data processing circuitry represents the circuitry that would otherwise exist in a conventional test system. It might for example compare the measured value with some expected values. The strobe signal for the latching circuitry is also fed to the data processing circuitry so that the strobe rate is known for fail processing.

Having described one embodiment, numerous alternative embodiments or variations might be made. For example, it was described that the synchronization between the DATA and DATA CLOCK signals is maintained by differential propagation delays in the interconnections between the DUT and the channel circuitry. In the preferred embodiment, it was described that the differential propagation delay was achieved through the use of cables with different transmission speeds. Differential propagation delay could also be achieved in whole or in part through cables of different lengths. Preferably, no more than a part of the differential delay is achieved by lengthening the cables 210(1) . . . 210(N), as excessive length will reduce signal integrity.

Also, it should be appreciated that there are many ways to produce cables with different propagation delays. The type of material used to make the conductors might be varied. Alternatively, the effective dielectric constant of cables 212(1) . . . 212(N) could be lowered by introducing air spaces in the dielectric. Or, various solid materials might be used. Moreover, it should be recognized that the term "transmission line" is used generally to describe a structure capable of transmitting a high frequency signal with relatively low loss.

Further, it should be appreciated that the number of connections is illustrative and not a limitation on the invention. For example, not every channel card in a test system is likely to receive DATA outputs from a source synchronous part. Some channel cards will generate the power signals and some will generate the inputs. Thus, it is not necessary that every channel card be connected to amplifier 122.

Also, it might be possible that there is more than one connection between amplifier 122 and each channel card. For example, each channel card might contain several chips, each chip in turn containing the circuitry to implement several channels. There might be one connection to each chip. In this way, there would be no additional differences in delay associated propagation from one point to another on the channel card.

As another example of a possible variation, it is not necessary that buffer amplifier 122 be attached on a separate module between DIB 118 and channel cards 116. Buffer amplifier 122 could be attached to DIB 118. Alternatively, buffer amplifier 122 might be attached to one of the channel cards 116.

Yet another variation that might be possible is that the connections described above could be implemented with single pieces of coax or multiple pieces of coax connected together to provide equivalent connections. Moreover, it is envisioned that shielded twisted pair and shielded parallel pair cables may also be used with the present invention.

As another example, it was described above that the DUT is connected to a socket. More generally, any type of contactor might be used to provide the connection points to the device under test.

Also, it should be appreciated that buffer amplifier 122 is an example of a fan out circuit. Other types of fan out circuits could be used, instead.

Further, it should be appreciated that many testers do not have separate main frames and test heads. In some testers, all of the circuitry is contained within a single test head. Thus, the specific test system described herein is illustrative rather than limiting.

Therefore, the invention should be limited only by the spirit and scope of the appended claims.

What is claimed is:

1. An automatic test system adapted for testing source synchronous parts, each part having data outputs and a data clock output, the automatic test system comprising:
 a) an interface unit having a support structure for receiving a device under test, the support structure providing connection points for the data outputs and data clock outputs of a device under test;
 b) a buffer amplifier, the amplifier having an input and an output, with the input being connected to the connection point for the data clock output;

c) a plurality of receive channel circuits, each of the receive channel circuits having a comparator circuit with a data input, a strobe input and an output, the output being latched in response to the strobe input;

d) a first plurality of transmission lines each carrying a signal between a connection point for the data outputs on the interface unit and a data input of the comparator circuit in a receive channel circuit; and e) a second plurality of transmission lines each carrying a signal between the output of the buffer amplifier and a strobe input of a comparator circuit of a receive channel;

f) wherein the second plurality of transmission lines introduces a shorter propagation delay than the first plurality of transmission paths.

2. The automatic test system of claim 1 wherein the interface unit comprises a device interface board.

3. The automatic test system of claim 1 wherein the first plurality of transmission lines and the second plurality of transmission lines comprise coaxial cables.

4. The automatic test system of claim 3 wherein the first plurality of transmission lines comprises coaxial cables with solid dielectric cores and the second plurality of transmission lines comprises coaxial cables with foamed dielectric cores.

5. The automatic test system of claim 1 wherein the support structure includes a printed circuit board and the buffer amplifier is mounted on the printed circuit board.

6. The automatic test system of claim 1 additionally comprising a module attached to the interface unit and wherein the buffer amplifier is mounted within the module.

7. An automatic test system adapted for testing source synchronous parts, each part having data outputs and an data clock output, the test system comprising:

a) a plurality of receive channel circuits each channel circuit having at least one data input and one strobe input, the channel circuit measuring the data at the data input in response to the strobe input;

b) a contactor adapted to connect to a device under test;

d) a fanout circuit having an input and an output, with the input connected to the contactor;

e) a coaxial cable of a first type having a first end and a second end, with the first end connected to the output of the fanout circuit and the second end connected to the strobe input;

d) a coaxial cable of a second type having a first end and a second end, with the first end connected to the contactor and the second end connected to the data input.

8. The automatic test system of claim 7 wherein the coaxial cable of the first type comprises a foamed dielectric.

9. The automatic test system of claim 7 wherein the coaxial cable of the first type has a dielectric with a lower dielectric constant than the coaxial cable of the second type.

10. The automatic test system of claim 7 wherein the fanout circuit comprises a buffer amplifier.

11. The automatic test system of claim 7 additionally comprising a plurality of coaxial cables of the second type.

12. The automatic test system of claim 7:

a) comprising at least one semiconductor chip and additional receive channel circuits, thereby creating a plurality of receive channel circuits;

b) wherein the plurality of receive channel circuits are located within the semiconductor chip; and c) comprising additional coaxial cables of the second type thereby creating a plurality of cables of the second type;

d) wherein each of the plurality of cables of the second type is connected to a receive channel circuit within the semiconductor chip and the coaxial cable of the first type is connected to the strobe input of each of the plurality of receive channels within the semiconductor chip.

13. The automatic test system of claim 7 wherein the coaxial cable of the first type has a propagation delay that is shorter than the coaxial cable of the second type.

14. The automatic test system of claim 13 wherein the fanout circuit has a delay associated therewith and wherein the delay through the fanout circuit and the first type cable is equivalent to the delay through the second type cable.

15. An automatic test system adapted for testing source synchronous parts, each part having data outputs and an data clock output, the test system comprising:

a) at least one channel card, having a plurality of semiconductor chips thereon, each such chip having a plurality of receive channel circuits therein, each receive channel circuit having at least a data input and a strobe input;

b) a contactor adapted to receive a device under test;

c) a fan out circuit connected to the contactor;

d) a first plurality of signal transmission paths between the contactor and the data inputs of the receive channels, the signal transmission paths including transmission lines supporting signal propagation at a first propagation delay;

e) a second plurality of signal transmission paths between the contactor and the strobe inputs of the receive channels, each of the second plurality of signal transmission paths including the fanout circuit and a transmission line supporting signal propagation at a second propagation delay, shorter than the first propagation delay.

16. The automatic test system of claim 15 the transmission lines supporting signal propagation at a first speed comprise coaxial cable having a solid core and transmission lines supporting signal propagation at a second speed comprise coaxial cable having a foam core.

17. The automatic test system of claim 16 wherein solid core and the foam core each comprises TEFLON.

18. The automatic test system of claim 15 the transmission lines supporting signal propagation at a first speed comprise coaxial cable having a dielectric core having a first dielectric constant and transmission lines supporting signal propagation at a second speed comprise coaxial cable having a dielectric core having a second dielectric constant lower than the first dielectric constant.

* * * * *